US009214529B2

(12) United States Patent
Chang et al.

(10) Patent No.: US 9,214,529 B2
(45) Date of Patent: Dec. 15, 2015

(54) FIN FET DEVICE WITH INDEPENDENT CONTROL GATE

(75) Inventors: Josephine B. Chang, Mahopac, NY (US); Michael A. Guillorn, Yorktown Heights, NY (US); Chung-hsun Lin, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 283 days.

(21) Appl. No.: 13/047,132

(22) Filed: Mar. 14, 2011

(65) Prior Publication Data

US 2012/0235234 A1    Sep. 20, 2012

(51) Int. Cl.
*H01L 29/66*  (2006.01)
*H01L 27/12*  (2006.01)
*H01L 29/78*  (2006.01)
*B82Y 10/00*  (2011.01)

(52) U.S. Cl.
CPC ........... *H01L 29/66545* (2013.01); *B82Y 10/00* (2013.01); *H01L 27/1211* (2013.01); *H01L 29/66795* (2013.01); *H01L 29/7855* (2013.01)

(58) Field of Classification Search
CPC ............ H01L 29/785; H01L 29/66745; H01L 27/1211; H01L 27/0886; H01L 21/823431; H01L 21/845
USPC .......... 257/316, 317, 321, 347, 328, E27.111, 257/E27.112, 270, 365
See application file for complete search history.

(56) References Cited

U.S. PATENT DOCUMENTS

| | | | |
|---|---|---|---|
| 6,677,204 B2 | 1/2004 | Cleeves | |
| 7,037,790 B2 | 5/2006 | Chang | |
| 7,148,526 B1 * | 12/2006 | An et al. | 257/288 |
| 7,192,876 B2 | 3/2007 | Mathew | |
| 7,208,794 B2 * | 4/2007 | Hofmann et al. | 257/314 |
| 7,288,805 B2 | 10/2007 | Anderson | |
| 7,329,580 B2 * | 2/2008 | Choi et al. | 438/257 |
| 7,425,740 B2 * | 9/2008 | Liu et al. | 257/306 |
| 7,462,538 B2 * | 12/2008 | Li et al. | 438/264 |
| 7,781,810 B1 * | 8/2010 | An et al. | 257/288 |
| 8,222,680 B2 * | 7/2012 | Lin | H01L 29/42384 257/288 |
| 2005/0205924 A1 * | 9/2005 | Yoon et al. | 257/317 |
| 2006/0197140 A1 | 9/2006 | Muralidhar | |
| 2006/0220131 A1 * | 10/2006 | Kinoshita et al. | 257/347 |
| 2007/0148857 A1 | 6/2007 | Ban | |
| 2007/0181930 A1 | 8/2007 | Zhu | |
| 2007/0201273 A1 | 8/2007 | Chuang | |
| 2007/0211526 A1 | 9/2007 | Burnett | |

* cited by examiner

*Primary Examiner* — Jesse Y Miyoshi
(74) *Attorney, Agent, or Firm* — David A. Cain; Hoffman Warnick LLC

(57) ABSTRACT

A FinFET device with an independent control gate, including: a silicon-on-insulator substrate; a non-planar multi-gate transistor disposed on the silicon-on-insulator substrate, the transistor comprising a conducting channel wrapped around a thin silicon fin; a source/drain extension region; an independently addressable control gate that is self-aligned to the fin and does not extend beyond the source/drain extension region, the control gate comprising: a thin layer of silicon nitride; and a plurality of spacers.

17 Claims, 14 Drawing Sheets

- Splits: Fin Height (H), Fin Width (D), Top Oxide (Top)
- Shorter and wider fin with thinner top oxide gives stronger Vth tunning efficiency

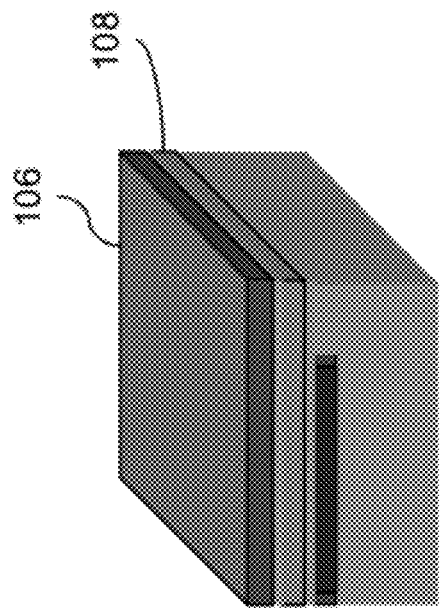
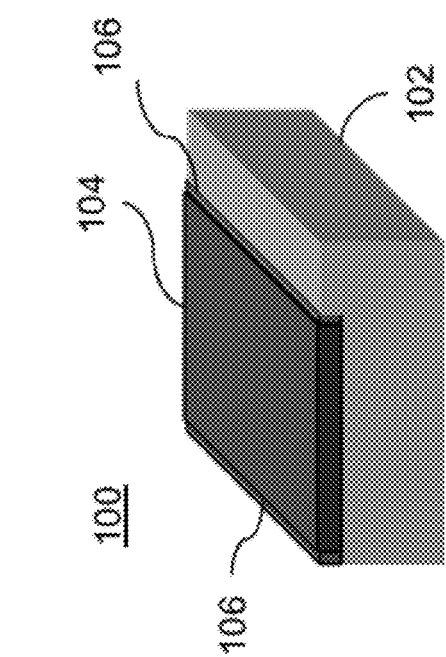
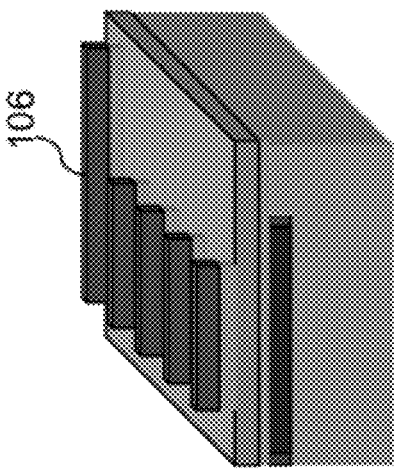

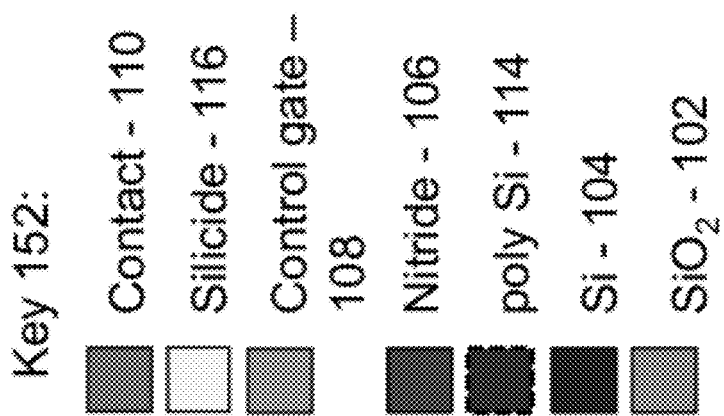
Key 152:
- Contact - 110
- Silicide - 116
- Control gate - 108
- Nitride - 106
- poly Si - 114
- Si - 104
- SiO$_2$ - 102
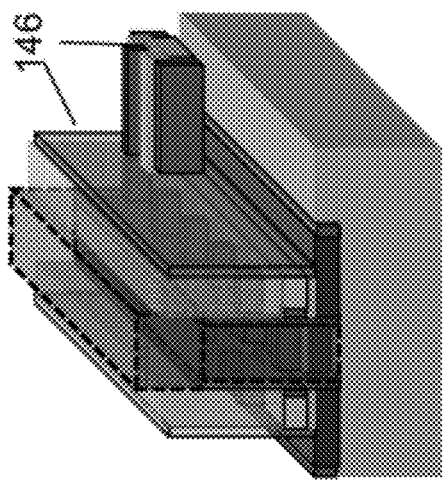
FIG. 1n
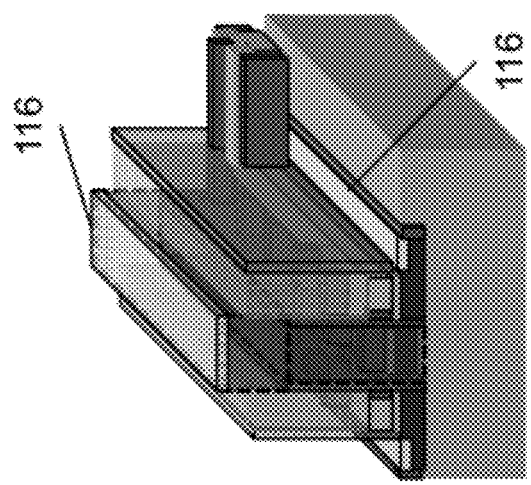
FIG. 1o

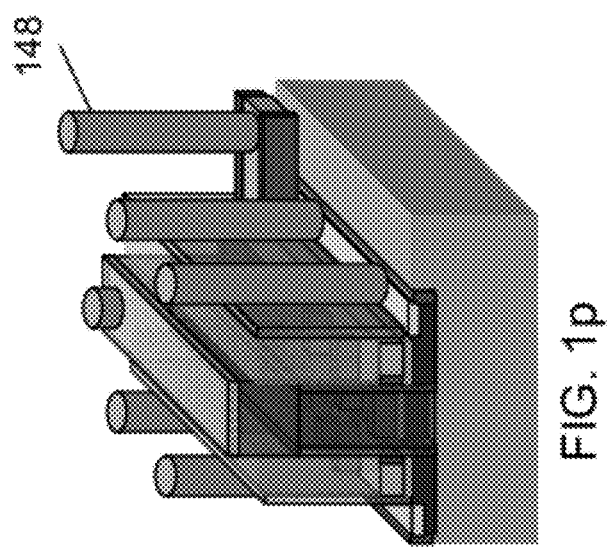

FIN FET DEVICE WITH INDEPENDENT CONTROL GATE

FIELD OF THE INVENTION

The invention disclosed broadly relates to the field of integrated circuit devices and more particularly relates to the field of control gates.

BACKGROUND OF THE INVENTION

Scaling of FinFET devices to dimensions relevant to and exceeding ground rule requirements for a 22 nm node requires the formation of one or more silicon (Si) fins on the order of 10-20 nm thick. A FinFET device is a nonplanar, double-gate transistor built on an SOI (silicon-on-insulator) substrate. The definition of this fin can be performed directly using a lithographic technique or an indirect patterning technique such as the sidewall image transfer (SIT) process. Regardless of the method, it is anticipated that control of the final fin width will be a significant issue in the manufacturing of FinFETs. Single nanometer variation in this parameter results in a ~7% change in the effective body thickness of the channel. As a consequence variability in the threshold voltage, Vt, of the device across the wafer is expected to be a concern.

For a 15 nm thick fin, a single nanometer variation results in a ~7% change in the effective body thickness of the channel. As a consequence, variability in the threshold voltage, Vt, of the device across the wafer is expected to be a concern. Control gates for other thin-body devices have been shown to be an effective way of electrically modulating Vt after completing device fabrication. However, due to the unique structure of a FinFET, integration of a control gate is problematic without compromising the integration density or electrical integrity of the device structure.

Therefore, there is a need for a solution to the FinFET shortcomings as described above.

SUMMARY OF THE INVENTION

Briefly, according to an embodiment of the invention a method comprises steps or acts of performing shallow trench isolation process on a substrate; depositing control gate oxide on the substrate, followed by a control gate material to form the control gate; depositing oxide and nitride layers on the control gate for use as fin and control gate hard-masks, wherein the hard-masks are used to define the control gate and fin; patterning the hard-masks; depositing a sacrifical gate material on the control gate; patterning the sacrifical gate material to produce a dummy gate pattern; depositing a sacrificial oxide layer over the dummy gate pattern, whereby the dummy gate pattern is obscured; planarizing the sacrificial oxide layer to reveal the obscured dummy gate; removing the dummy gate, wherein the removal forms trenches with the hard-mask disposed along the bottom of the control gate; introducing a slight lateral recess into the control gate using an isotropic wet etch; depositing a thin conformal film of SiN over the control gate; patterning the thin conformal film to form a first spacer; depositing a gate stack into the trenches; planarizing the gate stack using a pattern transfer technique; removing the sacrificial oxide; patterning to the gate stack to form a second spacer, wherein the second spacer comprises oxide; patterning the control gate material using the second spacer as a mask; depositing a layer of nitride; patterning the layer to form a third spacer that is needed to prevent the control gate to diffusion shorts during silicide formation; forming the silicide; and contacting the control gate over the shallow trench isolation to avoid control gate to source drain shorting.

BRIEF DESCRIPTION OF THE DRAWINGS

To describe the foregoing and other exemplary purposes, aspects, and advantages, we use the following detailed description of an exemplary embodiment of the invention with reference to the drawings, in which.

Figure 1E:
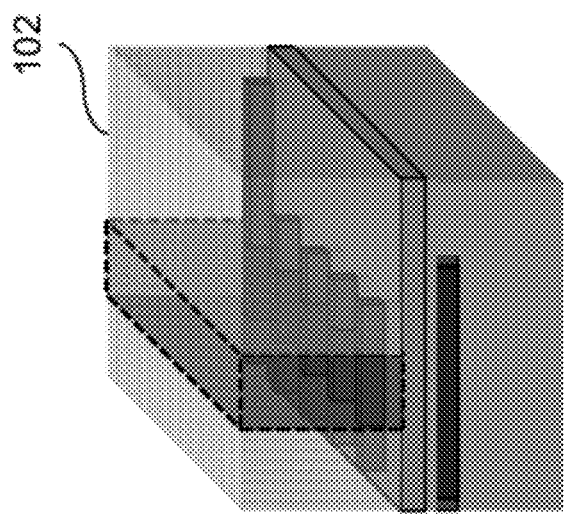
FIG. 1a through FIG. 1p show illustrative examples of the set of steps of the process according to an embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We discuss a fin-last replacement gate FinFET architecture that features an independently addressable control gate. The control gate can be used to compensate for non-uniformities in the fin thickness, offering a way to reduce variability in operating characteristics, such as threshold voltage (Vt). Similar to the standard fin-last replacement gate FinFET architecture, the gate we describe is self-aligned to the fins and source/drain (S/D) extension region and does not require epitaxial Si growth in the S/D region. The control gate is self-aligned to the individual fins and does not extend over the entire S/D region, minimizing the capacitance typically associated with "back gate" control gate schemes.

The control gate is passivated by a thin layer of Si nitride to help minimize active gate to control gate capacitance and alleviate the risk of shorting between the two (gates) electrodes. The control gate can be contacted outside of the source/drain region and should not impact the ability to scale the gate pitch. The gate pitch is primarily limited by the requirement to form three spacers.

Assuming a 20 nm gate, 20 nm total spacer thickness (sum of all spacers) and 30 nm contact via, a 100 nm gate pitch can be achieved with a 5 nm contact-to gate-overlay budget. Further reducing the gate length, total spacer thickness or contact size allows scaling to denser pitches.

Scaling of FinFET devices to dimensions relevant to and exceeding ground rule requirements for the 22 nm node requires the formation of one or more Si fins on the order of 15 nm thick. The definition of this fin can be performed directly using a lithographic technique or it can use an indirect patterning technique such as the sidewall image transfer (SIT) process. Regardless of the method, it is anticipated that control of the final fin width will be a significant issue in the manufacturing of FinFETs. Single nanometer variation in this parameter results in a ~7% change in the effective body thickness of the channel. As a consequence variability in the threshold voltage, Vt, of the device across the wafer is expected to be a concern.

Control gates for other thin-body devices have been shown to be an effective way of electrically modulating Vt after completing device fabrication. However, due to the unique structure of a FinFET, integration of a control gate is problematic without compromising the integration density or electrical integrity of the device structure.

The process begins by using the standard shallow trench isolation (STI) process commonly practiced for SOI devices (FIG. 1a). The control gate oxide is grown or deposited onto the SOI followed by deposition of the control gate material. Lastly, an oxide and nitride layers are deposited for use as the fin and control gate hard-masks (FIG. 1b). The oxide/nitride hard mask stacks are patterned using lithography and reactive ion etching (FIG. 1c).

Figure 1D:
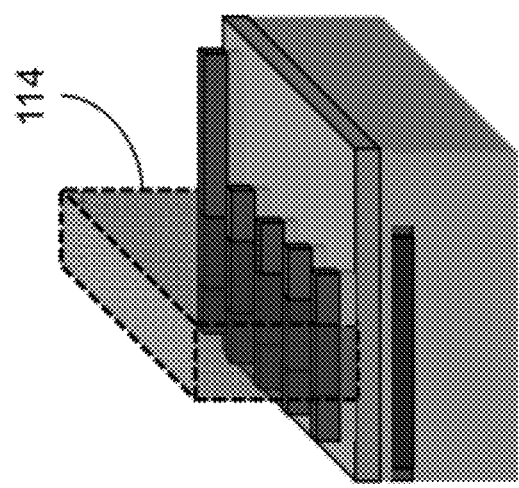
Figure 1G:
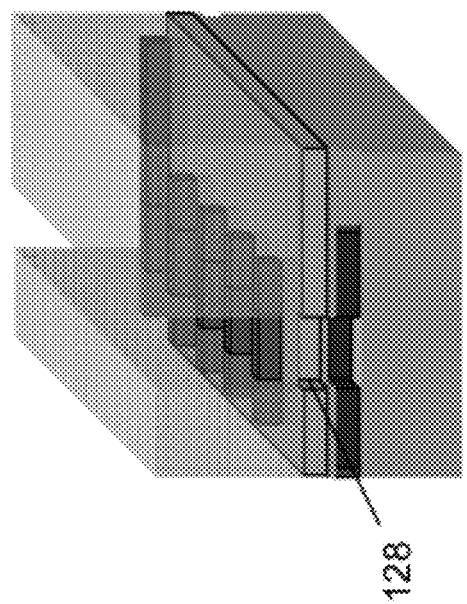
Figure 1F:
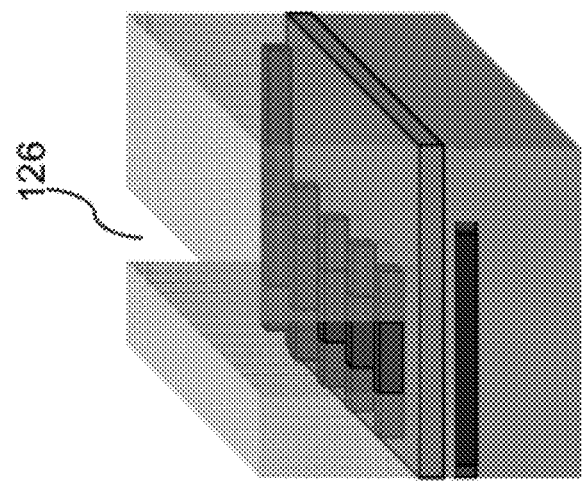
Figure 1I:
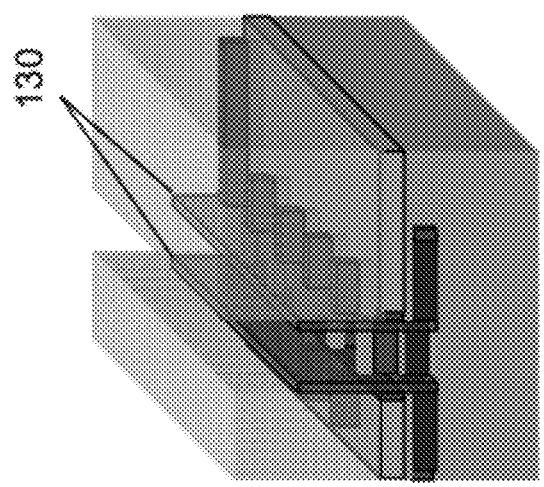
Figure 1H:
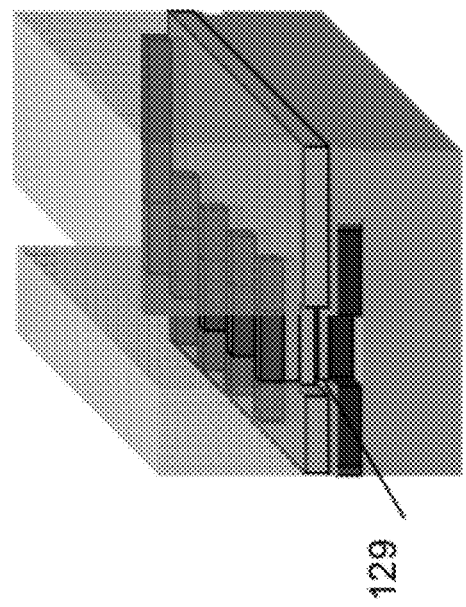

A sacrificial gate material (e.g. polysilicon) is deposited followed by lithography and etching to produce a "dummy-gate" pattern (FIG. 1d). A sacrificial oxide layer is deposited and planarized to reveal the dummy gate (FIG. 1e). At this time the dummy gate is removed forming trenches (FIG. 1f). The oxide/nitride hard mask materials shown in FIG. 1c lie at the bottom of these trenches and are used to define the control gate and fin of the device (FIG. 1g). A slight lateral recess is introduced into the control gate using an isotropic wet etch (FIG. 1h). A thin conformal film of SiN is deposited and reactive ion etching is performed to form a first spacer (FIG. 1i). Beyond acting as a sidewall spacer, the lateral recess of the control gate shown in FIG. 1h enables the SiN layer to act as passivation for the control gate.

Figure 1J:
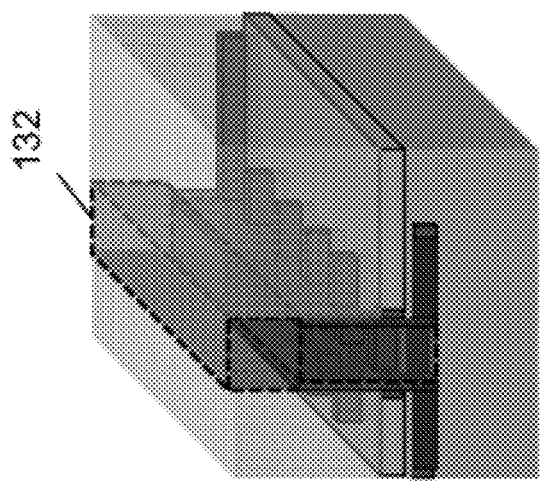
Figure 1K:
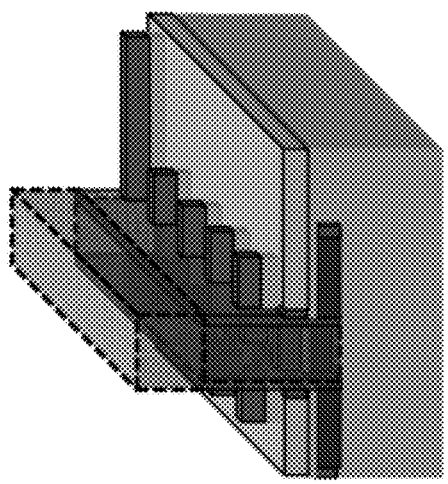
Figure 1M:
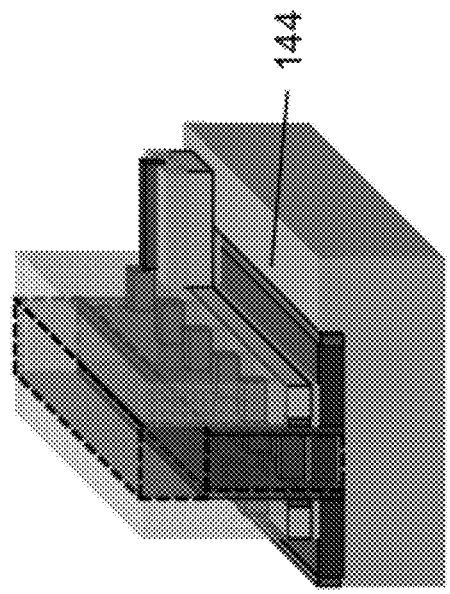
Figure 1L:
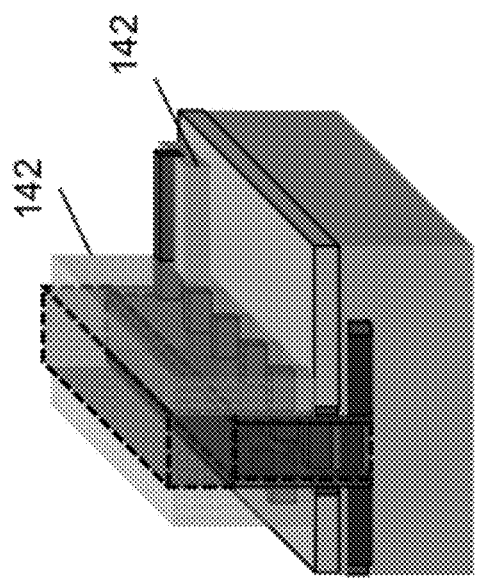

The gate stack is deposited into the trenches formed by the removal of the dummy gates and planarization is performed using a "damascene-gate" pattern transfer technique (FIG. 1j). The sacrificial oxide is removed (FIG. 1k). A second spacer is formed from a deposited oxide layer using reactive ion etching (FIG. 1l). This layer serves as a self-aligned etch mask for the patterning of the control gate material (FIG. 1m). A third and final spacer is formed by depositing a layer of SiN followed by reactive ion etching (FIG. 1n). This spacer is required to prevent control gate to diffusion shorts during Silicide formation (FIG. 1o). An overview of the contact scheme is shown in FIG. 1p. The control gate is contacted over STI to avoid control gate to source/drain shorting concerns.

Figure 6:
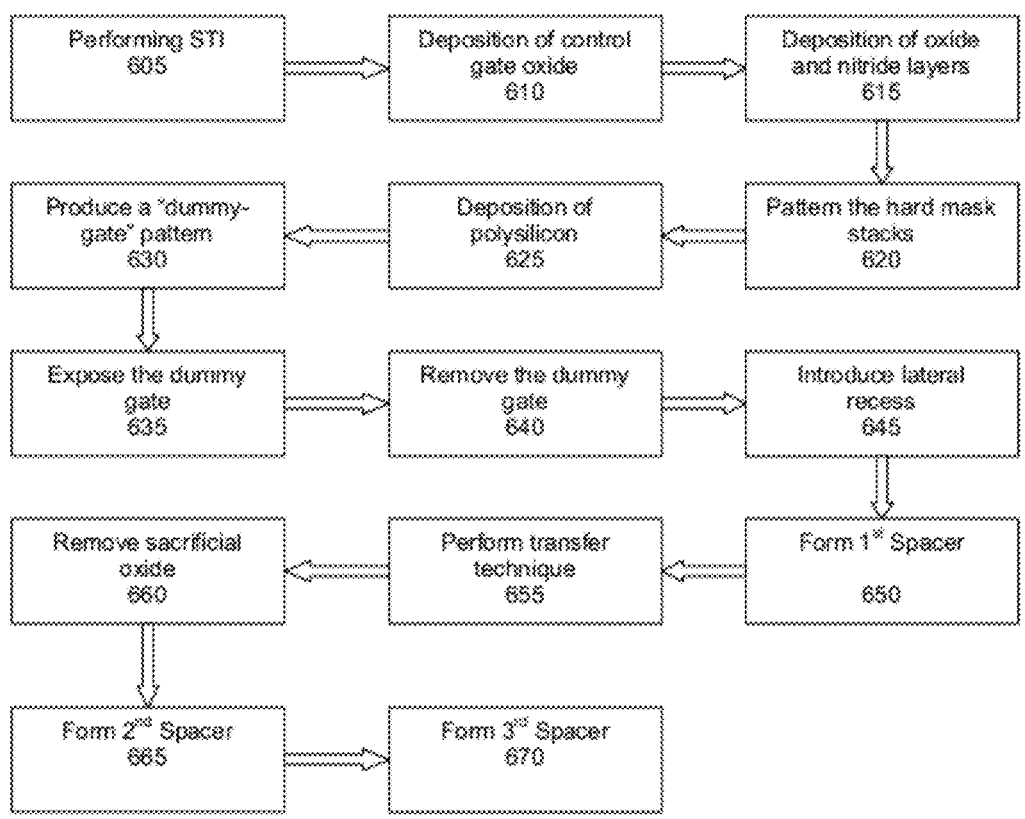
FIG. 6 is a flow chart of the method steps for producing an independently addressable control gate according to an embodiment of the present invention.

Referring now in specific detail to the drawings, and particularly to the flow chart of FIG. 6, the process for producing an independently addressable control gate begins at step 605 by performing the standard shallow trench isolation (STI) process commonly practiced for SOI devices, as illustrated in FIG. 1a. A SiO$_2$ substrate 102 has a Si layer 104 over it and a couple of Nitride strips 106 are included.

In FIG. 1a there is shown performing a standard shallow trench isolation process. A substrate 102 is made of SiO$_2$; a Si layer 104 and a pair of Nitride strips are deposited on the substrate 102.

FIG. 1b shows growing a control gate oxide, depositing a control gate material, depositing a oxide, and nitride hardmask. This step comprises growing a control gate oxide, depositing a control gate material, and depositing oxide and nitride hardmask.

FIG. 1c illustrates a step of patterning the fin/control gate hard mask stack (nitride and oxide) 106 into a set of fins.

FIG. 1d shows a step of depositing sacrificial gate poly 114 and etching.

FIG. 1e shows a step of depositing sacrificial oxide and planarizing.

Next, in step 610, the control gate oxide is grown or deposited onto the SOI (Silicon on insulator) followed by deposition of the control gate material 108. In step 615, oxide 108 and nitride 106 layers are deposited for use as the fin and control gate hard-masks, as illustrated in FIG. 1b. Following the deposition of the oxide 108 and nitride 106 layers, in step 620, the oxide/nitride hard mask stacks are patterned using lithography and reactive ion etching, as illustrated in FIG. 1c.

The process continues at step 625 with the deposition of a sacrificial gate material (e.g. polysilicon), followed by lithography and etching in step 630 to produce a "dummy-gate" pattern 114, as illustrated in FIG. 1d. In step 635, a sacrificial oxide layer 116 is deposited and planarized to reveal the dummy gate, as illustrated in FIG. 1e.

At this time, step 640 proceeds by removing the dummy poly gate 126, thereby forming trenches, as illustrated in FIG. 1f.

FIG. 1g shows patterning the fin/control gate 128 using the entrained hard mask (HM).

FIG. 1h shows laterally recessed control gate material 129 with isotropic wet etching.

FIG. 1i shows depositing a thin conformal nitride and form first spacer. The control gate lateral recess allows the formation of nitride passivation on the control gate sidewall 130.

The oxide/nitride hard-mask materials shown in FIG. 1c lie at the bottom of these trenches and are used to define the control gate and fin of the device (FIG. 1g). The process continues at step 645 where a slight lateral recess 129 is introduced into the control gate using an isotropic wet etch, as illustrated in FIG. 1h. Next, in step 650, a thin conformal film of SiN 130 is deposited and reactive ion etching is performed to form first spacer 130, as illustrated in FIG. 1i. Beyond acting as a sidewall spacer, the lateral recess of the control gate shown in FIG. 1h enables the SiN layer to act as passivation for the control gate.

In step 655, the gate stack is deposited into the trenches formed by the removal of the dummy gates and planarization is performed using a "damascene-gate" pattern transfer technique, as shown in FIG. 1j. In step 660, the sacrificial oxide is removed, as shown in FIG. 1k. Following, this, in step 665, a second spacer 142 is formed from a deposited oxide layer using reactive ion etching (see FIG. 1l). This layer 144 serves as a self aligned etch mask for the patterning of the control gate material (FIG. 1m).

In step 670, a third and final spacer 146 is formed by depositing a layer of SiN followed by reactive ion etching, as shown in FIG. 1n. This spacer is required to prevent control gate to diffusion shorts during Silicide formation 116 (see FIG. 1o). An overview of the contact scheme is shown in FIG. 1p. The control gate 148 is contacted over STI to avoid control gate to source/drain shorting concerns.

Figure 2:
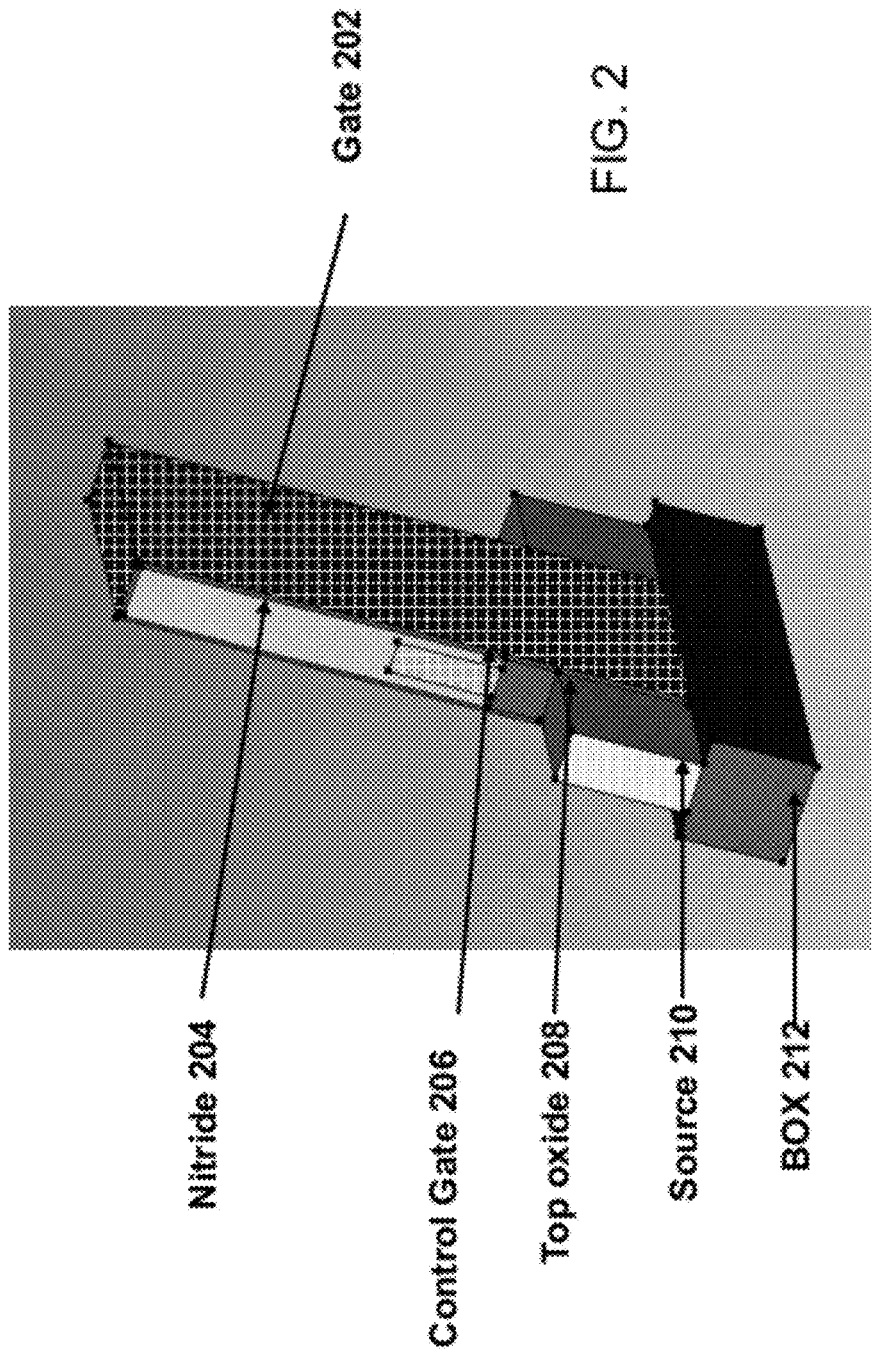
FIG. 2 shows a three-dimensional device simulation of a FinFET according to an embodiment of the invention.

Referring to FIG. 2, a three-dimensional device simulation is shown. A gate 202 is shown coupled with a Nitride structure 204, a control gate is shown on the Nitride layer 204, a top oxide 208, a source region 210 is coupled with the top oxide 208, and a buried oxide (BOX) 212.

Figure 3:
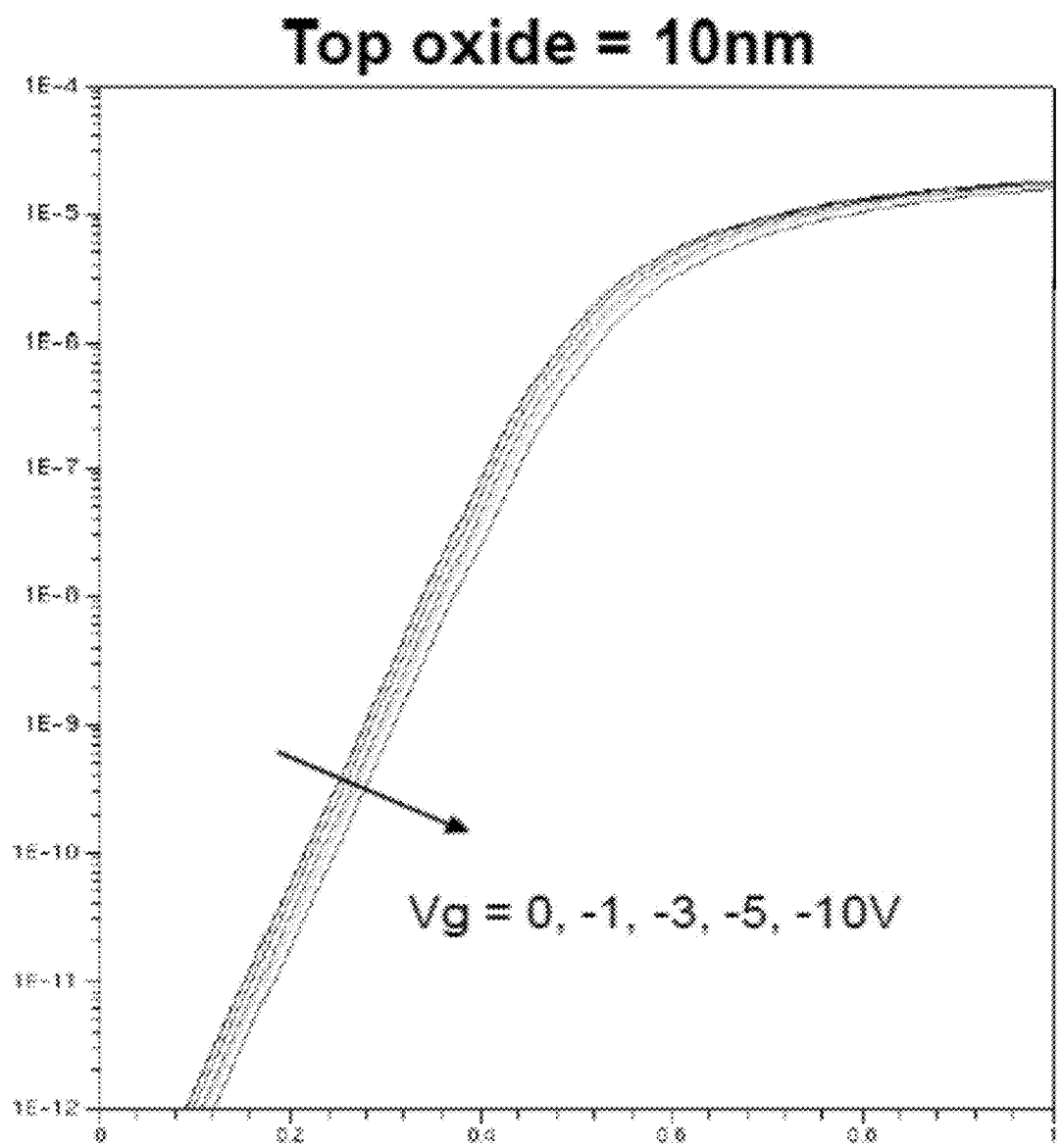
FIG. 3 is a graph of Id-Vg characteristics for a top oxide width of 10 nano-meters.
Figure 4:
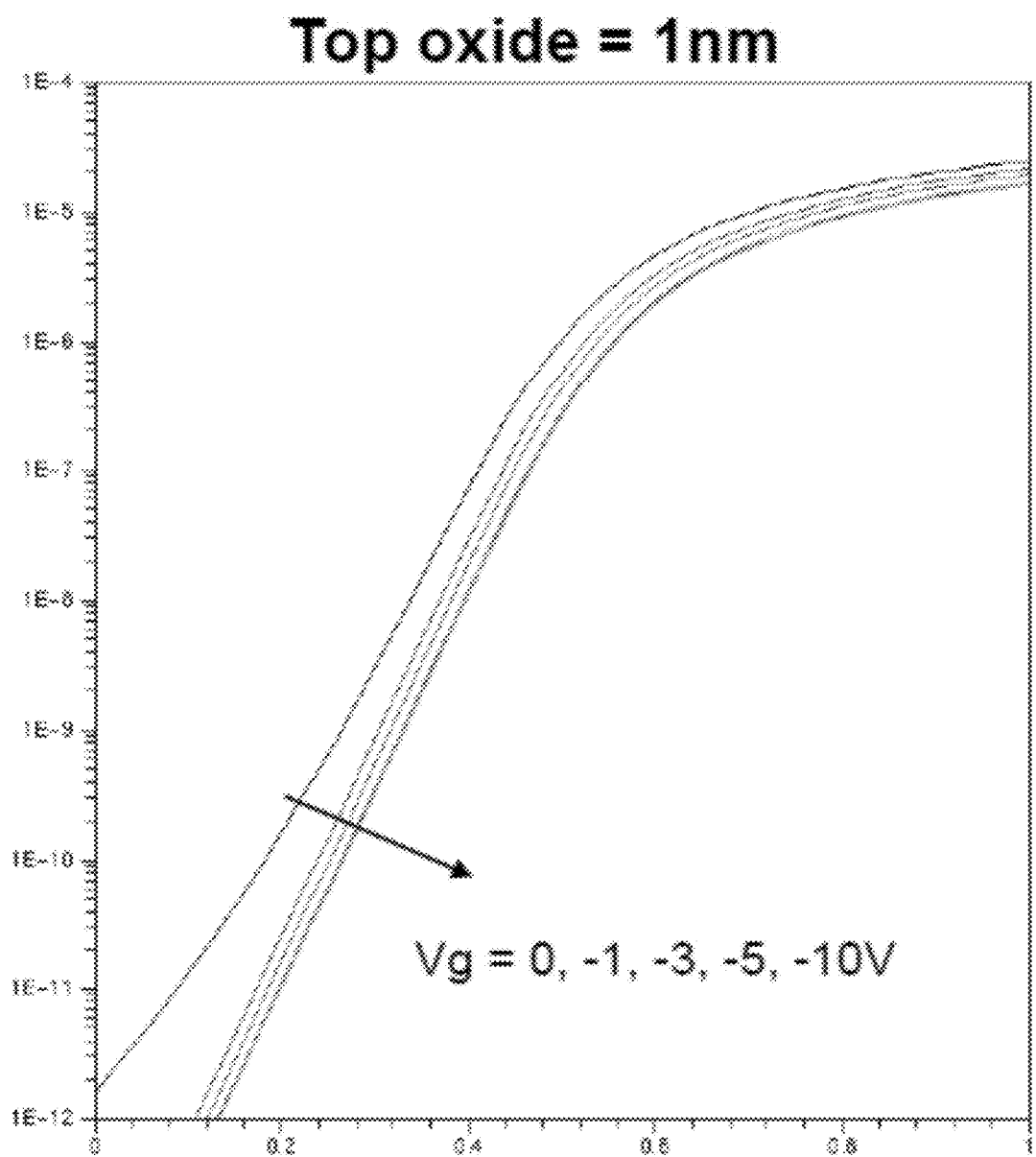
FIG. 4 is a graph of Id-Vg characteristics for a top oxide width of one nano-meter.
Figure 5:
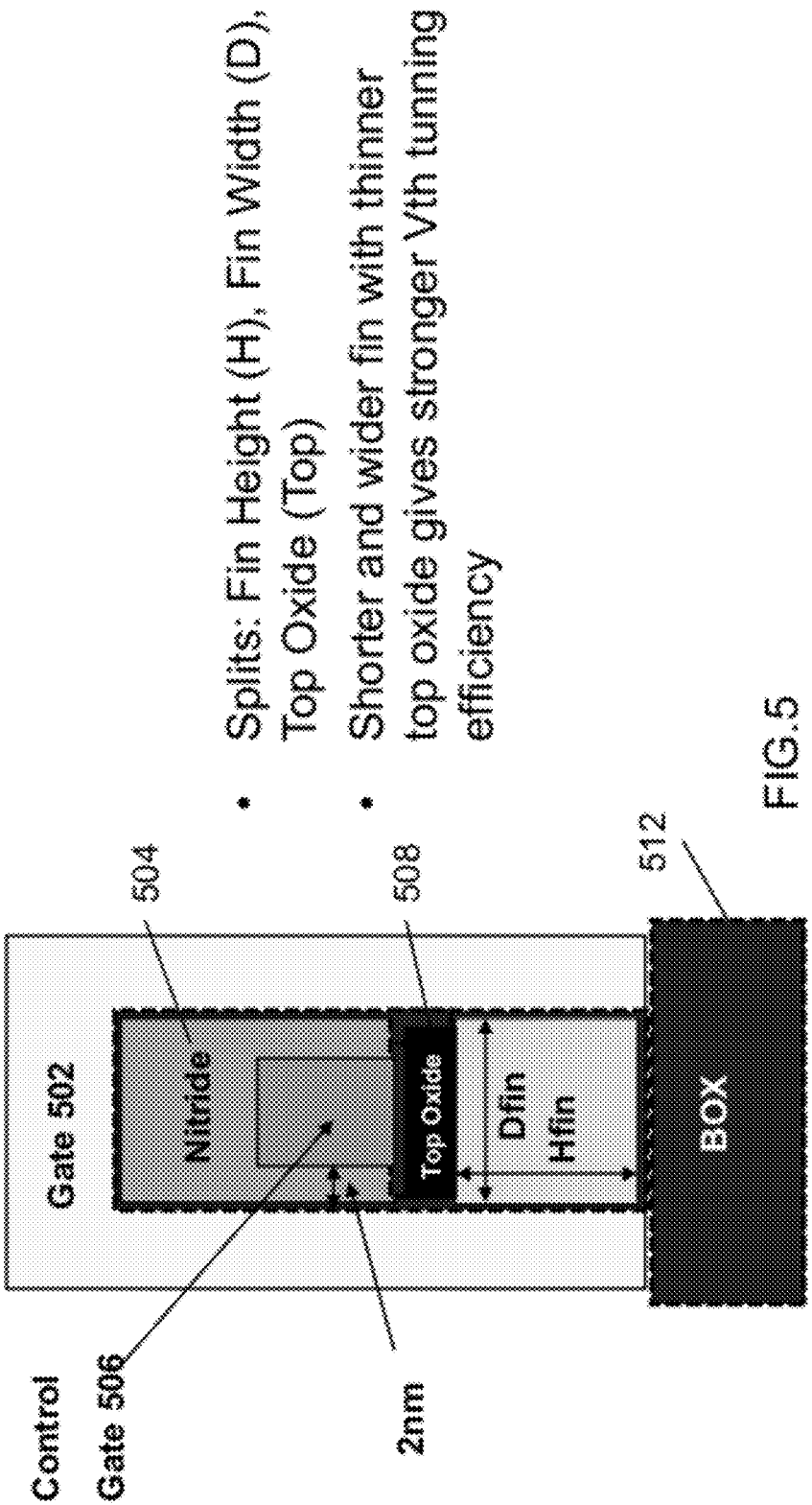
FIG. 5 is a cross section of a FIG. 3 is a graph of Id-Vg characteristics for a top oxide width of 10 nano-meters.

FIG. 3 is a graph of Id-Vg characteristics for a top oxide width of 10 nano-meters. FIG. 4 is a graph of Id-Vg characteristics for a top oxide width of one nano-meter. FIG. 5 is a cross section of a FinFET device according to another embodiment of the invention. The FinFET device comprises a gate 502, a Nitride 504, a control gate 506, a top Oxide 508, a source/drain region, and a BOX 512. Shorter and wider fin with thinner top oxide gives stronger $V_{th}$ tuning efficiency.

Figure 7:
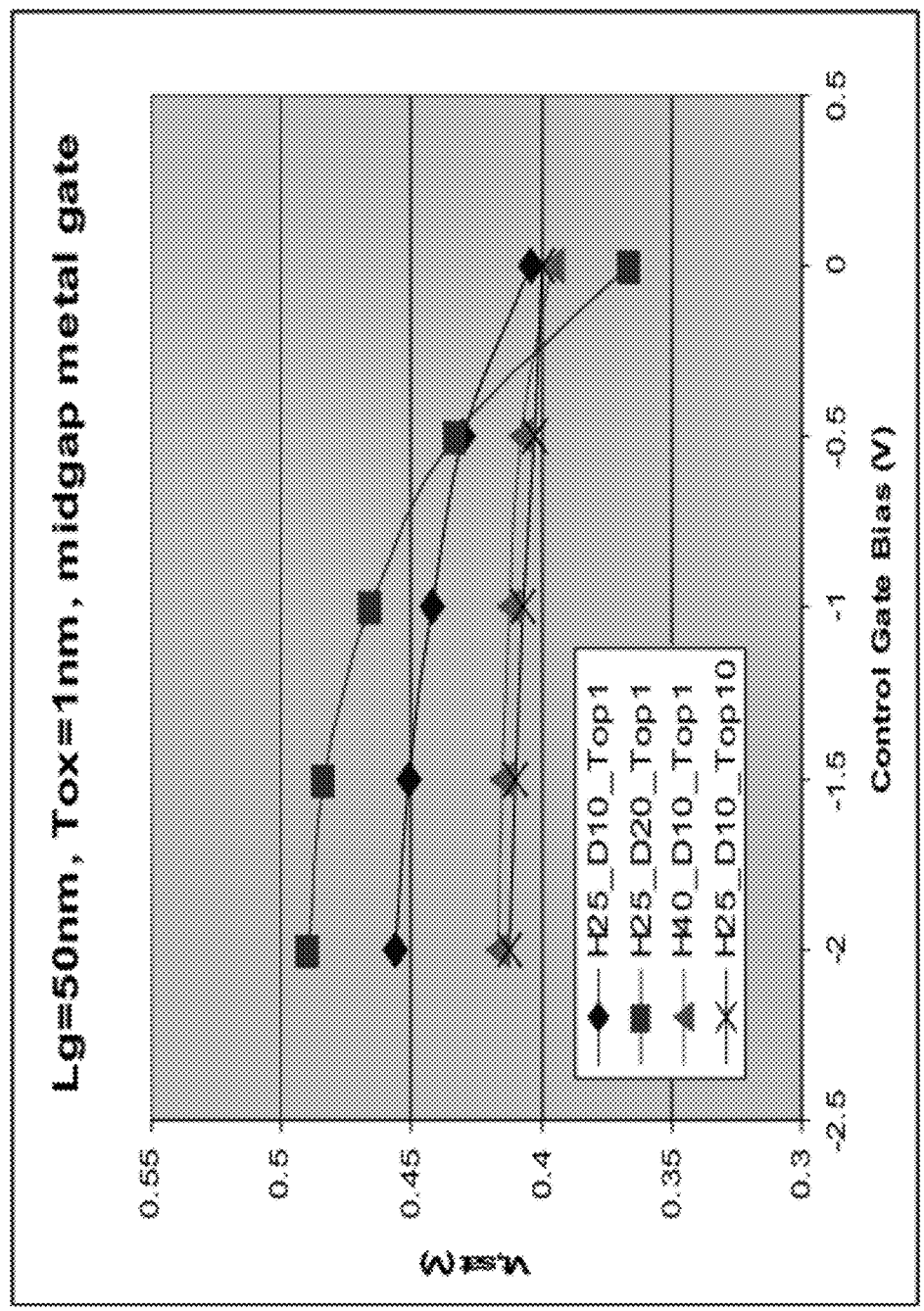
FIG. 7 is a graphical illustration of how the FinFET architecture with shorter and wider fins with thinner top oxide thickness provides an optimized y for a given capacitance penalty, according to an embodiment of the present invention.

FIG. 7 provides a graphical illustration of how the FinFET architecture with the shorter and wider fin with thinner top oxide thickness provides the optimized y for a given capacitance penalty.

Therefore, while there has been described what is presently considered to be the preferred embodiment, it will understood by those skilled in the art that other modifications can be made within the spirit of the invention. The above description(s) of embodiment(s) is not intended to be exhaustive or limiting in scope. The embodiment(s), as described, were chosen in order to explain the principles of the invention, show its practical application, and enable those with ordinary skill in the art to understand how to make and use the invention. It should be understood that the invention is not limited to the embodiment(s) described above, but rather should be interpreted within the full meaning and scope of the appended claims.

We claim:

1. A FinFET device with an independent control gate, said FinFET device comprising:
   a substrate on which shallow trench isolation has been performed;
   an independent control gate disposed on a fin, and comprising:
   control gate material deposited on control gate oxide, wherein the fin includes an overall fin width and the control gate material includes an overall width dimension less than the overall fin width;
   an encapsulating dielectric layer formed in lateral recesses introduced into the control gate material, said encapsulating dielectric layer to provide passivation on sidewalls of the independent control gate;
   the encapsulating dielectric layer including a thin conformal film of SiN deposited over the control gate material;
   a gate stack formed over the encapsulating dielectric layer;
   a nitride spacer preventing control gate to source/drain shorts during silicide formation; and
   a source/drain region extending beyond the independent control gate.

2. The FinFET device of claim 1 further comprising a buried oxide region coupled to the source/drain region.

3. The FinFET device of claim 1 further comprising a control gate oxide disposed between the source/drain region and the independent control gate.

4. The FinFET device of claim 3 wherein the control gate oxide comprises a thickness of one nm.

5. The FinFET device of claim 1 wherein fin thickness is no thicker than 15 nm.

6. The FinFET device of claim 1 wherein the lateral recess is etched into the control gate material.

7. The FinFET device of claim 1 further comprising:
   contacts over the shallow trench isolation.

8. The FinFET device of claim 1 wherein the nitride spacer is formed by depositing a layer of SiN followed by reactive ion etching.

9. The FinFET device of claim 1 wherein the substrate is a silicon-on-insulator substrate.

10. A fin field effect transistor (FinFET) device, comprising:
    a fin;
    a top dielectric formed on a top of the fin;
    an independent control gate material formed on the top dielectric, the independent control gate material being recessed on lateral sides thereof, wherein the fin includes an overall fin width and the independent control gate material includes an overall width dimension less than the overall fin width;
    an encapsulation layer formed in the recesses and over a top of the independent control gate material; and
    a gate conductor formed over the encapsulation layer and a gate dielectric formed on sides of the fin such that the independent control gate material tunes a voltage of the gate conductor to control a device channel formed by the fin for the FinFET device.

11. The device as recited in claim 10, wherein spacers are formed in a trench, which define the independent control gate material and the fin.

12. The device as recited in claim 10, wherein the recess is etched into the independent control gate material.

13. The device as recited in claim 10, wherein a thin conformal film of SiN is formed over the independent control gate material, to form a first spacer.

14. The device as recited of claim 10, wherein a source/drain region extends beyond the independent control gate material.

15. The device as recited in claim 10 wherein the independent control gate material can be contacted outside of the source/drain region.

16. The device as recited of claim 10, wherein the top dielectric comprises a thickness of about one nm.

17. The device as recited in claim 10 wherein the substrate is a silicon-on-insulator substrate.

\* \* \* \* \*